United States Patent [19]

Gailliard et al.

[11] Patent Number: 5,074,246

[45] Date of Patent: Dec. 24, 1991

[54] DEVICE TO COVER A FLAT SURFACE WITH A LAYER OF UNIFORM THICKNESS

[75] Inventors: Jean-Pierre Gailliard, Grenoble; Aimé Perrin, St. Ismier, both of France

[73] Assignee: Commissariat a l'Energie Atomique, France

[21] Appl. No.: 490,138

[22] Filed: Mar. 7, 1990

[30] Foreign Application Priority Data

Mar. 8, 1989 [IR] Iran ................................. 8903028

[51] Int. Cl.$^5$ ................................. C23C 14/24
[52] U.S. Cl. ................................. 118/730; 118/715
[58] Field of Search ................................. 118/715, 730

[56] References Cited

U.S. PATENT DOCUMENTS

| | | | |
|---|---|---|---|
| 3,746,571 | 7/1973 | Little | 117/105.4 |
| 3,783,822 | 1/1974 | Wollam | 118/730 |
| 3,858,547 | 1/1975 | Bergfelt | 118/49 |
| 4,010,710 | 3/1977 | Williams | 118/730 |
| 5,002,011 | 3/1991 | Ohmine | 118/730 |

FOREIGN PATENT DOCUMENTS 483497 8/1967 Fed. Rep. of Germany .

*Primary Examiner*—Richard Bueker
*Attorney, Agent, or Firm*—Hayes, Soloway, Hennessey & Hage

[57] ABSTRACT

Apparatus and method for depositing on the flat surface (4) of a substrate (1) a layer of uniform thickness of particles emitted by a source (5). The substrate (1) is held at the extremity of a radial arm (2) which arm in turn is carried on a rotating axis (3). The substrate also rotates on the arm (2) and is carried on the arm so that the flat surface (4) is orientated such that a line drawn normal to the flat surface forms an angle ($\theta$) with the axis (3). The apparatus is particularly suited for the production of optical parts.

7 Claims, 1 Drawing Sheet

DEVICE TO COVER A FLAT SURFACE WITH A LAYER OF UNIFORM THICKNESS

FIELD OF THE INVENTION the present invention concerns a device to cover a flat surface with a layer of uniform thickness, said layer being composed of particles emitted by a source.

BACKGROUND OF THE INVENTION

The techniques for carrying out superficial depositings of materials on substrates are well known and consist of evaporating or vaporizing a source which emits particles along a divergent beam in the direction of the substrate. Various methods to uniform the thickness of deposits have been proposed. For example, it is possible to place the substrates on the inner face of a dome-shaped support whose curvature center is close to the source. However, this solution can only be considered for simultaneously carrying out deposits on a large number of small substrates and not on extremely large flat substrates.

The technique closest approximating the method of the invention consists of making the substrate rotate around an axis parallel to the median emission direction of the beam, the axis being able to be possibly merged with this direction. The radial arm bears at its extremity the substrate whose outgoing normal line is either parallel to the axis or directed towards the latter. The surface to be covered in this case is turned towards the inside of the device. It is then advantageous to make the substrate itself rotate simultaneously at a speed of rotation normally clearly greater than the speed of rotation of the axis. In this way, a planet wheel motion of the substrate is embodied.

However, it is not possible to obtain deposits having thickness variations of less than 2% on large substrates (300 mm in diameter, for example). The chief objective of the invention is to obtain much better results.

The solution retained consists of inclining the substrate with respect to the axis of rotation so as to outwardly orientate its face receiving the deposit. Although this disposition may go against the previously described techniques of the prior art where an attempt is made to orientate the substrate in the direction of the source, it nevertheless considerably—and surprisingly—improves the uniformity of deposits.

Furthermore, the uniformity remains excellent as regards all the emissivity characteristics of the source: computer simulations have been conducted by making the coefficients of the expansion vary into a series of cosine powers $\theta$, a series whereby it is possible to characterize the intensity of radiation for any emission direction according to the angle $\theta$ it forms with the median emission direction of the beam. Extremely stable results have thus been obtained.

SUMMARY OF THE INVENTION

The object of the invention is therefore to provide a device to cover a flat surface with a layer of uniform thickness, said layer being formed of particles emitted by a source and including a rotating axis and provided with a radial arm, the radial arm being provided at its extremity opposite the axis with rotating support means of the flat surface marking on the flat surface a movement of rotation or revolution within its plane, said device being characterized in that the rotating support means are constituted so that the flat surface is orientated outside the device and the outgoing normal line derived from the flat surface forms an angle $\theta$ of more than ten degrees with the axis.

BRIEF DESCRIPTION OF THE DRAWINGS

The following description clearly shows how the invention may be embodied with reference to the accompanying figures, given by way of illustration and being in no way restrictive, in which.

DETAILED DESCRIPTION OF THE PREFERRED EMBODIMENTS

Figure 1:
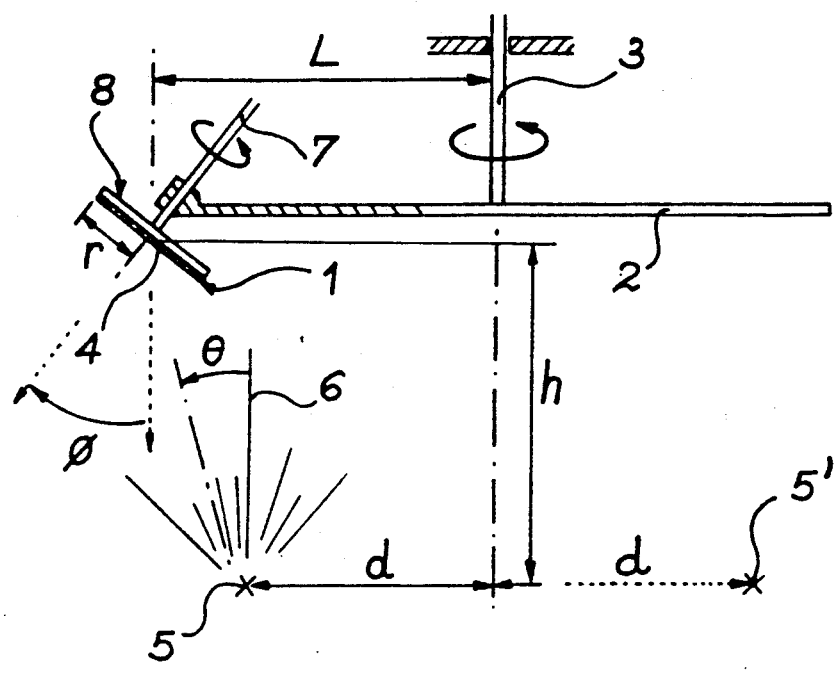
FIG. 1 diagrammatically represents an implementation device of the invention.

The flat substrate 1 to be covered is, in this particular case, a disk with radius r. It is secured to a substrate holder 8 situated at one extremity of a radial arm 2 with length L. The arm 2 is solidly fixed at its other extremity to a vertical axis 3. According to the invention, the face 4 of the substrate required to be covered is orientated outside the device.

Motor devices ensure the rotation of the axis 3 and another axis 7 borne by the arm 2 and to which the substrate holder 8 is attached. The second rotation speed is clearly greater than the first rotation speed.

Whilst rotating, the substrate 1 thus follows a circular trajectory.

The center of the substrate 1 is spaced from the horizontal plane containing the source 5 by a height h and this source has a median emission axis 6 (axis of the emission cone) parallel to the axis 3 which is moved out of center by a distance d. The particles emitted by the source 5 move along radiant trajectories able to be defined by the angle $\theta$ they form with the median emission axis 6.

Figure 2:
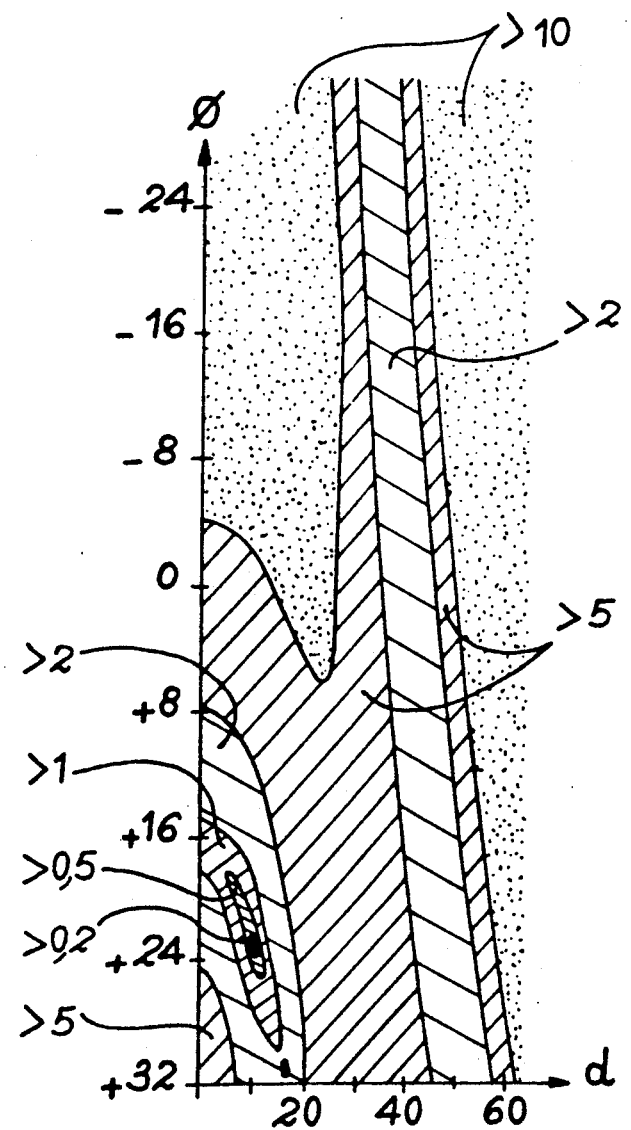
FIG. 2 shows the results obtained.

The emission indicatrix of the source 5 according to the angle $\theta$ may be defined by a series expansion of cosine powers $\theta$. FIG. 2 represents, in the form of an abacus with two inlets d and $\phi$, the maximum percentages of thickness homogeneity defects obtained on the substrate 1, irrespective of the coefficients of the cos power series expansion $\theta$, limited to the power 7. Thus, h=60 cm, L=23 cm and r=15 cm. There is one preferential zone where the homogeneity of the thicknesses deposited is particularly suitable and, as regards this example, corresponds to short distances d less than about 20 cm and to relatively sharp angles of inclination $\phi$ of the substrate 1, namely of more than about 10°. The largest place of this zone corresponds to a distance d between 9 cm and about 12.5 cm and to an angle $\phi$ between 21° and 23°. The uniformity disparities y are between 0.2% and 0.5%. These results show that the invention makes it possible to carry out depositings having satisfactory uniformity, even if the shape of the emission indicatrix of the source varies over a particular period of time, this normally being the case with electron guns where the charge deepens relatively quickly.

Other tests have been conducted: they reveal the persistance of a range with good thickness uniformity for covering the substrate 1 for angles $\phi$ close to those mentioned, still orientated outwardly and usually between 18° and 25°. With plausible configurations, it is possible to regard the optimal angle $\phi$ as being between 15° and 30°.

According to r, h and L, table I shows the best values of the parameters d and $\phi$. All the lengths are given in centimeters.

TABLE I

| r | h | L | d | $\phi$ |
|---|---|---|---|---|
| 15 | 60 | 30 | 18 | 18 |
| 15 | 60 | 26 | 14 or 15 | 20 |
| 15 | 60 | 23 | 10 | 22 |
| 15 | 60 | 20 | 4 | 25 |
| 15 | 50 | 20 | 10 | 22 |
| 15 | 40 | 20 | 12 | 20 |

The invention may be used with a single source situated inside the extension of the axis 3 (d=0); this configuration makes it possible to use an "extended" source with a radius of more than 1 cm.

Thus, good covering uniformities have been obtained with, for example, h=60 cm, L=20 cm, r=15 cm and $\phi$=24°, the source having a radius of 6 cm. The arm 2 may be replaced by a wheel or a similar structure so as to simultaneously cover several substrates.

So as to increase the speed of depositing, it is possible to use an annular source of radius d or a plurality of sources, including a 5' source shown on FIG. 1 and disposed on a circle with a radius d.

One advantageous application of the device concerns the production of optical fibers possibly having a large diameter. The dimensions of the substrate 1 may be relatively large with respect to its spacing from the source 5, as in the example described, which ensures that a considerable part of the radiation is intercepted.

What is claimed is:

1. An apparatus for depositing a substantially uniform layer of particles on the surface of a planar substrate comprising:
    a. a first shaft adapted for rotation about a first axis, provided with a first means for causing rotation;
    b. a radial arm rigidly attached to said first shaft;
    c. a second shaft adapted for rotation about a second axis different from said first axis, said second shaft being provided with a second means for causing rotation, and said second shaft being attached to one end of said radial arm;
    d. a substrate holder coaxially mounted on one end of said second shaft for removably fixing said planar substrate, said substrate holder being oriented such that a line which is both normal to the surface of said substrate and intersects said holder at the center of said holder, and a third axis, parallel to said first axis and intersecting said substrate holder at its center, forms and angle of at least ten degrees, said substrate holder also being oriented such that the surface of said substrate faces away from said first axis; and
    e. At least one particle source for emitting particles along a divergent beam in the direction of said substrate.

2. An apparatus according to claim 1, wherein said source comprises a point source located at a predetermined distance from said first axis.

3. An apparatus according to claim 1, wherein said radial arm has a length greater than the distance between said source and said first shaft.

4. An apparatus according to claim 1, wherein said source comprises a radiation source means.

5. An apparatus according to claim 1, wherein said angle is between fifteen degrees and thirty degrees.

6. An apparatus according to claim 1, wherein said source is coaxial with said first axis and wherein said source has a radius that is greater than one centimeter.

7. An apparatus according to claim 6, wherein said source comprises a plurality of elemental sources disposed in a circular configuration the center of which is coaxial with said first axis.

* * * * *